United States Patent [19]

Joshi et al.

[11] Patent Number: 5,731,245
[45] Date of Patent: Mar. 24, 1998

[54] HIGH ASPECT RATIO LOW RESISTIVITY LINES/VIAS WITH A TUNGSTEN-GERMANIUM ALLOY HARD CAP

[75] Inventors: Rajiv Vasant Joshi; Manu Jamnadas Tejwani, both of Yorktown Heights; Kris Venkatraman Srikrishnan, Wappingers Falls, all of N.Y.

[73] Assignee: International Business Machines Corp., Armonk, N.Y.

[21] Appl. No.: 738,901

[22] Filed: Oct. 28, 1996

Related U.S. Application Data

[62] Division of Ser. No. 479,406, Jun. 7, 1995, which is a division of Ser. No. 286,605, Aug. 5, 1994, abandoned.

[51] Int. Cl.$^6$ .............................................. H01L 21/302
[52] U.S. Cl. ...................... 438/705; 438/693; 438/697; 438/752; 438/754
[58] Field of Search ...................... 156/636.1, 645.1, 156/656.1; 216/88, 89, 18; 437/228; 438/705, 693, 697, 752, 754

[56] References Cited

U.S. PATENT DOCUMENTS

| | | | |
|---|---|---|---|
| 3,167,462 | 1/1965 | Winkelman | 148/180 |
| 3,222,630 | 12/1965 | Gorman | 338/322 |
| 3,501,829 | 3/1970 | Corwin | 29/577 |
| 4,022,625 | 5/1977 | Shelton | 106/3 |
| 4,188,710 | 2/1980 | Davey et al. | 438/508 |
| 4,207,546 | 6/1980 | Grudkowski | 333/152 |
| 4,301,188 | 11/1981 | Niehaus | 438/537 |
| 4,321,099 | 3/1982 | Stirn et al. | 438/89 |
| 4,908,182 | 3/1990 | Whang | 420/430 |
| 4,956,015 | 9/1990 | Okajima et al. | 252/79.1 |
| 5,121,174 | 6/1992 | Forgerson, II et al. | 257/271 |
| 5,169,803 | 12/1992 | Miyakawa | 438/625 |
| 5,262,354 | 11/1993 | Cote et al. | 437/195 |
| 5,300,130 | 4/1994 | Rostoker | 51/309 |
| 5,300,813 | 4/1994 | Joshi et al. | 257/752 |
| 5,308,794 | 5/1994 | Tu | 438/652 |
| 5,314,840 | 5/1994 | Schepis et al. | 437/194 |
| 5,332,467 | 7/1994 | Sune et al. | 156/636.1 |
| 5,356,513 | 10/1994 | Burke et al. | 156/636.1 |
| 5,527,423 | 6/1996 | Neville et al. | 156/636.1 |

FOREIGN PATENT DOCUMENTS

| | | |
|---|---|---|
| 0499050A1 | 8/1992 | European Pat. Off. |
| 01-107558 | 4/1989 | Japan |

OTHER PUBLICATIONS

"Al–Ge Reflow Sputtering for Submicron–Contact Hole Filling"; K. Kikuta et al.; VMIC Conference, Jun. 11–12, 1991, pp. 163–169.

"0.25um Contact Hole Filling by Al–Ge Reflow Sputtering"; K. Kikuta et al.; 1991 Symposium on VLSI Technology, Digest of Technical Papers, May 28–30, 1991.

"Binary Alloy Phase Diagrams"; Thaddeus B. Massalski et al.; American Society for Metals; TN 690 .B5, 1986; vol. 1.

"Constitution of Binary Alloys"; Max Hansen; Second Edition; Armour Research Foundation, Chicago, IL; 1958.

"A Dictionary of Metallurgy"; Merriman; TN609, M47, 1958, pp. 5.

Primary Examiner—Robert Kunemund
Assistant Examiner—Anita Alanko
Attorney, Agent, or Firm—Whitham, Curtis Whitham & McGinn

[57] ABSTRACT

A structure and method for fabricating circuits which use field effect transistors (FETs), bipolar transistors, or BiC-MOS (combined Bipolar/Complementary Metal Oxide Silicon structures), uses low temperature germanium gas flow to affect metals and alloys deposited in high aspect ratio structures including lines and vias. By using a germanium gas flow, germanium (Ge) will be introduced in a surface reaction which prevents voids and side seams and which also provides a passivating layer of CuGe. If a hard cap is needed for surface passivation or a wear-resistance application, the GeH$_4$ gas followed by WF$_6$ can be used to produce an in-situ hard cap and polish stop of W$_x$Ge$_y$, a tungsten-germanium alloy. Further, high aspect ratio vias/lines (aspect ratio of 3 or more) can be filled by utilizing low pressures and high temperatures (i.e., below 450° C.) without degrading the underlying metals.

3 Claims, 11 Drawing Sheets

HIGH ASPECT RATIO LOW RESISTIVITY LINES/VIAS WITH A TUNGSTEN-GERMANIUM ALLOY HARD CAP

This application is a divisional of application Ser. No. 08/479,406, filed on Jun. 7, 1995, which is a divisional of application Ser. No. 08/286,605, now abandoned, filed on Aug. 5, 1994.

FIELD OF THE INVENTION

The present invention generally relates to a structure and method for fabricating circuits which use field effect transistors (FETs), bipolar transistors, or BiCMOS (combined Bipolar/Complementary Metal Oxide Silicon structures), and more particularly to a metallization and a method for producing the metallization for interconnecting wiring in an integrated circuit.

The process of the invention uses low temperature germanium gas flow to affect metals and alloys deposited in high aspect ratio structures including lines and vias. By using a germanium gas flow, germanium (Ge) will be introduced in a surface reaction which prevents voids and side seams and which also provides a passivating layer of CuGe. Secondly, if a hard cap is needed for surface passivation or a wear-resistance application, the $GeH_4$ gas followed by $WF_6$ can be used to produce an in-situ hard cap of $W_xGe_y$.

Thirdly, the invention relates to filling high aspect ratio vias/lines (aspect ratio of 3 or more) by utilizing low pressures and low temperatures (i.e., below 450° C.) without degrading the underlying metals. Additionally, filling can be achieved using an inventive relationship of other sputtering process parameters to that of step coverage.

DESCRIPTION OF THE RELATED ART

Low resistivity metals such as aluminum and copper and their binary and ternary alloys have been widely explored as fine line interconnects in semiconductor manufacturing. Typical examples of fine line interconnect metals include $Al_xCu_y$, where the sum of x and y is equal to one and both x and y are greater than or equal to zero and less than or equal to one, ternary alloys such as Al—Pd—Cu and Al—Pd—Nb, Al—Cu—Si, and other similar low resistivity metal-based alloys. Emphasis on scaling down line width dimensions in very large scale integrated (VLSI) circuitry manufacture has led to reliability problems including inadequate isolation, electromigration, and planarization.

Damascene processes using metal filling vias and lines followed by chemical/mechanical polishing (CMP) with various Al, Cu and Cu-based alloys are a key element of future wiring technologies for very large-scale system integration (VLSI). A key problem is filling high aspect ratio vias and lines without voids or seams, and creating homogeneous structures. Metallo-organic chemical vapor deposition (MOCVD) appears to be a promising method but only in the beginning stages of fabrication, and the deposition rates are very slow and the in-situ deposition of thin lines is very difficult. Additionally, laser melting appears promising but many issues remain in applying such a fabrication method. Furthermore, high temperature bias sputtering (i.e., above 450° C.) technique has been attempted but this technique has limitations below 1 μm geometries. Additionally, such high temperatures would degrade the underlying metals.

Additionally, conventional techniques such as chemical vapor deposition (CVD) or plating appear promising but as yet have not been applied to fabrication of such a structure. Currently, there is no method which allows the use of physical vapor deposition (PVD) techniques or which improves the quality of CVD or plating films if required for filling high aspect ratio vias and lines.

Further, low resistivity Cu or Al lines are being evaluated for back-end metallization and packaging applications. However, good fill of these alloys in submicron lines is still challenging as the existing techniques mentioned above lack adequate filling properties. The exotic and expensive CVD methods to deposit Cu or Al—Cu (e.g., metallo-organic chemical vapor deposition (MOCVD), laser melting, high-temperature bias sputtering, Al—Ge on poly substrate, etc.) are being explored, but have drawbacks as mentioned above. Another alternative would be formation of low eutectic Al—Ge by sputtering, but this technique requires different targets and a fixed composition degrades the lines' electromigration properties.

Plating is an inexpensive technique, but it cannot deposit any combination of alloys (e.g., Al—Cu, Al—Nb—Pd, etc). Additionally, pure Cu from Al—Cu alloy is known for its poor corrosion resistance. Further, any selective technique is prone to loss of selectivity and therefore the capping of dense Al—Cu lines, without affecting the yield, remains a great challenge.

Presently, 4 Mb and 16 Mb memories typically employ Al—Cu lines and W via interconnects. CVD is used to conformally deposit W into the vias. However, as dimensions decrease and current densities increase, W will have to be replaced with a different metal similar to the ones used for the first metal layer (M1) or second metal layer (M2) interconnect structure to form the hard layer. A suitable choice would be Al—Cu or Cu. However, these metals are very difficult to deposit by CVD, because of very slow deposition rates, the lack of a good precursor, and because deposition occurs at temperatures, such as above 450° C., that are believed too high for back-end-of-line (BEOL) applications.

In one example of the conventional techniques, (as disclosed for example, in Kikuta et al. *PROC. OF* 1991 *VMIC CONFERENCE*, pp.163–170 and Kikuta et al., "0.25 μm Contact Hole Filling by Al—Ge Reflow Sputtering", *Proceedings of the* 1991 *Symposium on VLSI Technology*, pp.35–36), sputtered Al—Ge material was used for via fill. However, this structure exhibited high line and via resistance and also required a polysilicon underlayer. Further, only a binary alloy is described and in a technique in which alloying is homogeneous, a high Ge content is required and thermal stability is degraded.

It is well-known to deposit low resistivity metals such as Al—Cu by increasing the temperature close to its melting point (e.g., 580° C.) and reflowing it by using substrate biasing. Such high temperatures as well as bias degrades the already deposited metal layers and causes diffusion as well. Normally, these temperatures in the conventional methods are above 475° C.

Other problems of the conventional structures and methods have been that damascene of soft metals (e.g., metals such as Al—Cu, Cu, alloys of Al, etc.) shows scratching and smearing using harder suspension particles in the slurry due to that conventional sputtering techniques are unable to fill lines including high temperature, bias sputtering. Significant challenges exist in filling and forming scratch-free, soft metal lines and the conventional methods have been unable to provide a practical and effective solution thereto.

SUMMARY OF THE INVENTION

It is therefore an object of the present invention to provide a low-cost, corrosion-free, wear-resistant, electromigration-resistant, electrical conductor interconnecting circuits on a substrate on a submicron scale using a method with a high process yield. To achieve this object, the process of the invention uses low temperature germanium gas flow to affect metals and alloys deposited in high aspect ratio structures including lines and vias. By using a germanium containing source such as $GeH_4$, $Ge_2H_6$ etc. gas, germanium (Ge) is introduced in a surface reaction which prevents voids and side seams and which also provides a passivating layer of CuGe.

Another object is to provide a method for filling high aspect ratio and lines without voids at temperatures much lower than the conventional methods.

It is another object of the invention to provide a low resistivity line or via with a wear resistant, hard cap which reduces electromigration. Thus, as discussed below, if the hard cap is needed for surface passivation or a wear-resistance application, the $GeH_4$ gas followed by $WF_6$ can be used to produce an in-situ hard cap of $W_xGe_y$.

Further, an object of the invention is to fill high aspect ratio vias/lines (aspect ratio of 3 or more) by utilizing low pressures and low temperatures (i.e., below 450° C.) without degrading the underlying metals.

Yet another object of the invention is to optimize material filling by using an inventive relationship of other sputtering process parameters to that of step coverage.

In one aspect of the present invention, a cost-effective structure for interconnecting wiring in an integrated circuit is provided, which includes a metal alloy for forming at least one of a line and via within a dielectric structure having sidewalls. The metal alloy includes a first element selected from the group consisting of aluminum, gold and silver and a second element of germanium. The metal alloy includes first regions of germanium in a range of from 0 to 40 at. percent and second regions of germanium in the range of from 60 to 100 at. percent.

In a second aspect of the present invention, a process is provided for forming a metal alloy on a substrate having an upper surface, the method comprising the steps of heating the upper surface of the substrate to a temperature in a range between 300° to 450° C., and flowing a gas containing germanium over the upper surface of the substrate, the upper surface having regions containing exposed aluminum, whereby the germanium in the gas reacts with the aluminum to form an aluminum alloy for flowing into adjacent openings due to surface tension of the aluminum alloy.

The present inventors have experimentally shown that by using PVD in combination with a reaction of $GeH_4$, vias can be filled by forming low eutectic alloys. PVD offers any combination of binary and ternary alloys with Al. This structure, produced by surface reaction, is advantageous over the conventional systems which use only Al—Ge by bias sputtering. The low temperature (preferably within the range of 300°–450° C. and more preferably between 300°–400 C.) CVD reaction/deposition is compatible with the use of both organic and inorganic insulators/dielectrics.

Thus, for example, conventional CMOS processes which integrate Al/Cu with polyimide with backfilling of polyimide to fill gaps, can be replaced with the inventive technique, without the concerns of stress associated with W. Since the metallurgy is essentially controlled by the PVD methods, there is no electromigration degradation. This technique is especially attractive where a slight resistance penalty is acceptable (e.g., can replace W stud), and simultaneously planarization needs can be minimized and metal film stress concerns can be avoided.

Additionally, the CVD technique provides conformality with surface diffusion and passivation of the sidewalls of the structure and, by forming the low melting point eutectic only in the vias by selectively using $GeH_4$, the technique is very advantageous for process implementation.

Furthermore, the inventive structure and method provide for germanium to be selectively added near the areas of the voids or seams in metallized features. Further, formation of a low temperature melting of a Al—Ge—M (ternary alloy etc., in which M can be Nb, Pd, Cu etc.) eutectic achieves the filling of the vias/trenches. The flow of Ge is only at the surface (melting of Al—Ge—M, etc.). Thus, a graded composition can be advantageously created. With the invention, there is no degradation of via resistance, as in the conventional structures, and the electromigration of the Al—Cu—Ge system. Additionally, unique interconnect sidewall passivated structures can be formed by the invention.

In another aspect, the structure and technique according to the present invention have also solved scratching and filling problems using a two-step surface reaction of $GeH_4$ and $WF_6$. Further, conventional low cost and resistivity PVD alloy can be used for filling in combination with a short (5–10 minutes) exposure of $GeH_4$, followed by a reaction of $WF_6$ and $GeH_4$. Preferably, the deposition temperature is substantially close to 400° C. or below. This temperature is much lower than that employed in the conventional systems. Indeed, the conventional systems and techniques employ temperatures generally above 450° C. Further, depending on the exposure of $GeH_4$, stable metal phases with Ge can be formed (e.g., $Cu_3Ge$ etc.). Additionally, a good polish stop is provided in the form of $W_xGe_y$. The hard capped $W_xGe_y$ can be formed in one step and, with the invention, there is no degradation of line resistance and the electromigration of Al—Cu—Ge system can be improved in relation to the conventional systems.

Thirdly, the invention relates to improving filling of high aspect ratio vies and lines using low resistivity metal alloys (e.g., Al—Cu) at low temperatures and pressures using sputtering. The advantages of low pressures includes achieving directionality of surface diffusion into vias or lines. The temperatures employed are well below 450° C. Using the conditions given in Table 3 below, the dual damascene structure is formed as shown in FIGS. 10(a)–10(c) also discussed below.

Further, according to the present invention, material filling is optimized by using an inventive relationship of other sputtering process parameters to that of step coverage.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

Figure 1A:
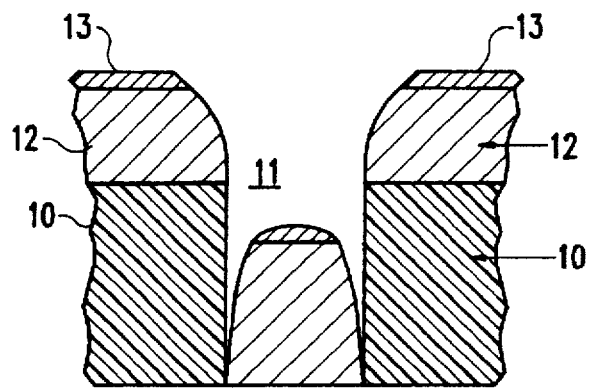
FIGS. 1(a)–1(b) are cross-sectional views of a semiconductor substrate according to a first aspect of the present invention.

Referring now to the drawings, and more particularly to FIG. 1, there is shown a structure and process according to the present invention. The invention is particularly useful in fabricating circuits using FETs, bipolars, or BiCMOS, and is especially useful for lithographic structures less than 0.5 microns, (e.g., those commonly encountered with the 64 Mb and 256 Mb DRAM structures). Of course, the invention is not limited to such applications and it is envisioned that the invention could be easily tailored to other applications by one ordinarily skilled in the art reading this application.

Generally, the process of the invention uses low temperature germanium gas flow to affect metals and alloys deposited in high aspect ratio structures including lines and vias. The metals and alloys preferably include a first element which preferably is an element from the group of aluminum, gold and silver, and a second element of germanium. The metal alloy preferably has first regions of germanium in a range of from 0 to 40 at. percent and second regions of germanium in the range of from 60 to 100 at. percent. The metal alloy preferably includes a third region of Al—Ge and Cu$_3$Ge. The second region of the metal alloy advantageously includes a ternary metal alloy and the metallization preferably includes a layer of W$_x$Ge$_y$ over the metal alloy.

By using a germanium gas flow, Ge will be introduced in a surface reaction that will prevent the appearance of voids and side seams. The surface reaction is also useful in that it also provides a passivating layer of CuGe. Additionally, the germanium gas flow with WF$_6$ produces a hard cap layer of W$_x$Ge$_y$.

More specifically, the inventive structure and method fills high aspect ratio lines/vias using surface reactions of GeH$_4$ and WF$_6$, in which a low resistivity alloy (e.g., Al$_x$Cu$_y$, x+y=1.0<x<1) can be deposited either by chemical vapor deposition (CVD), plating or physical vapor deposition (PVD) techniques.

The gradual flows of GeH$_4$ at elevated temperatures on these alloys result in filling up voids or gaps present at the seams or at the sides by forming in-situ low eutectic Al—M—Ge or Cu—Ge alloy.

In another aspect of the invention, by slowly introducing WF$_6$, a hard, wear-resistant coating (W$_x$Ge$_y$) is deposited on top of an Al—Cu—Ge layer as a polish stop for soft alloys. After forming the lines/vias, the W alloy cap can be removed by an SF$_6$ reactive ion etching (RIE) process or the like. The resulting structure formed by the reaction of GeH$_4$ is unique and improves electromigration of the structure.

It should be understood that the techniques and resulting structures are not limited to using any specific substrates and dielectric overlays. Moreover, the invention is not restricted to any particular metal combinations; rather, an objective of the invention is to overlay a relatively soft, low resistance metal or metal alloy with a hard refractory metal which can withstand wear, corrosion and electromigration, and then produce a surface reaction with Ge. The invention has particular relevance to electrical systems which use aluminum and copper alloys, but can also be equally used to advantage with other metal alloys.

Looking at the invention in greater detail, a structure and process for filling high aspect ratio vias/lines with low resistivity metal by forming its low melting point eutectic alloy will now be disclosed. Also, the formation of the hard cap of W—Ge as a polishing stop will also be described.

Generally, as shown in FIGS. 1–5, first GeH$_4$ is introduced and then WF$_6$ is introduced gradually to form a bilayer structure of Al—Cu—Ge/W$_x$Ge$_y$. Here, the GeH$_4$ gas is employed for filling of the low resistivity alloys deposited practically by any method. For example, any PVD, plating or CVD technique can be used in combination with GeH$_4$. Examples of such fillings are shown in FIGS. 1–5 and as described below.

Figure 1B:
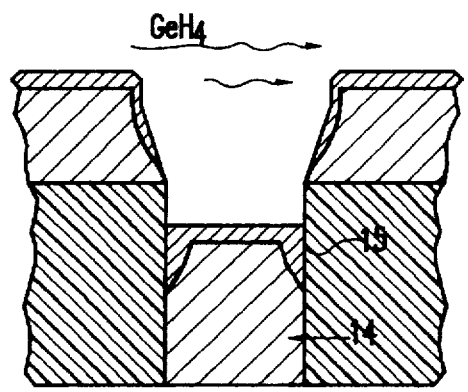

In a first example, as shown in FIGS. 1(a) and 1(b), a substrate (not illustrated) is first overcoated with a dielectric which is subsequently patterned.

The substrate is preferably silicon, silicon germanium, germanium, gallium arsenide, or some other material which is suitable for making integrated circuits. However, the substrate may be a ceramic, glass, or composite material commonly used for packaging semiconductors and for making thin film interconnections. The substrate preferably has a plurality of semiconductor devices formed therein which may include field effect transistors (FETs), bipolar transistors, BiCMOS, resistors, Schottky diodes, or the like. Of course, the substrate can have any of the attributes discussed above plus many other attributes known within the art.

The dielectric (a single layer, as shown in the drawings, or a composite having a plurality of layers) may be formed of organic and/or inorganic materials. The inorganic materials may be silicon dioxide (SiO$_2$), silicon nitride (Si$_3$N$_4$), or the like. The dielectric 10 is preferably deposited using plasma-enhanced chemical vapor deposition (PECVD). An organic dielectric layer, such as a polyimide or diamond-like carbon (DLC), may be deposited on top or between one or more inorganic layers of the dielectric.

Alternative to a dielectric composite created by a plurality of layers, a single layer of an inorganic dielectric, such as SiO$_2$, PSG, or BPSG, or an organic dielectric, such as polyimide, may also be employed and may be deposited by any of a number of well-known techniques such as by growing in an oxidative atmosphere, sputtering, or PECVD. While FIGS. 1(a) and 1(b) show the use of a single dielectric layer, it is understood that the dielectric layer 10 is not limited to the practice of this invention and that any dielectric (e.g., inorganic or organic) used by itself or in combination could be employed in the practice of this invention.

An opening 11 is formed in the dielectric composite, and this opening may be a via or a trench for a conductive line.

In VLSI applications, the substrate is likely to have several hundred to thousands of openings 11 like that shown in FIG. 1(a) where the resulting dense, complex pattern will ultimately interconnect circuits on or in the substrate. The openings 11 are preferably formed using contrast-enhanced lithography (CEL) followed by trench or hole etching with a multiwafer tool using $CHF_3$ and $O_2$ with an optimum overetch to ensure that the opening 11 has the desired dimensions and extends to a contact on the surface of the substrate for a via stud pattern.

For line patterns, the dielectric layers are preferably partially etched to a depth about 10% higher than the metal thickness to be employed. When etching polyimide, $O_2$ RIE at low temperatures is preferred. It should be understood that the formation of the opening 11 is well understood within the art and can be created by many different techniques.

Thereafter, a suitable material 12 such as Ti followed by Al—Cu or Cu, is deposited by PVD (e.g., evaporated, collimated sputtering or sputtering without collimation, etc.) in the openings 11 (e.g., trenches/vias) and over the dielectric 10. Instead of Al, gold or silver can be advantageously used.

Then, a refractory metal layer 13 is deposited on top of the Al—Cu or Cu on the dielectric and in the trenches. Due to shadowing effects, PVD (e.g., evaporation) exhibits seams at the sides of the structure. Seams are problematic in such structures since they pose reliability problems.

Thereafter, a $GeH_4$ gas is flowed across the top surface of the Al—Cu or Cu layer 12, and the vias are filled. Preferably, the $GeH_4$ is flowed at a pressure of 1 mT to 760 Torr, and more preferably 1 Torr, and at a temperature of 300° C. to 450° C., and more preferably 380° C. to 400° C. Using $GeH_4$ in combination with Al—Cu lowers the eutectic point of Al—Cu and fills the vias.

As mentioned above, the top of the Al—Cu or Cu is preferably capped as shown in FIG. 1(a) with the refractory metal. The refractory metal layer can be titanium (Ti), titanium alloys or compounds such as Ti/TiN, tungsten (W), titanium/tungsten (Ti/W) alloys, or chromium (Cr) or tantalum (Ta) and their alloys, or some other suitable material. Such a refractory metal cap prevents the surface reaction from progressing and promotes the side reaction.

Preferably, the metalization 14, as shown in FIGS. 1(a)–1(b) is $Al_xCu_y$, where the sum of x and y is equal to one and both x and y are greater than or equal to zero and less than or equal to one. However, ternary alloys such as Al—Pd—Cu and multicomponent alloys such as Al—Pd—Nb—Au are also be suitable. The principal characteristic of the metalization 14 is that it is a low resistivity and soft material compared to the refractory metal cap 13.

Preferably, the opening 11, which represents the line pattern or interlevel via pattern, is filled with the metalization 14 to a depth of 100 to 400 nm below the surface of the line or via.

After reacting this structure with $GeH_4$ as shown in Equation 1, the side seams are filled with its low melting point eutectic alloy 15 which is Al—Cu—Ge, as shown in FIG. 1(b).

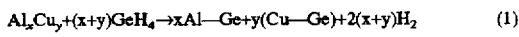

$$Al_xCu_y+(x+y)GeH_4 \rightarrow xAl—Ge+y(Cu—Ge)+2(x+y)H_2 \quad (1)$$

Figure 2A:
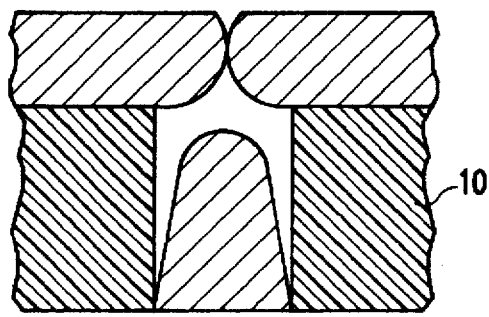
FIGS. 2(a)–2(b) are cross-sectional views of a semiconductor substrate according to a second aspect of the present invention.
Figure 2B:
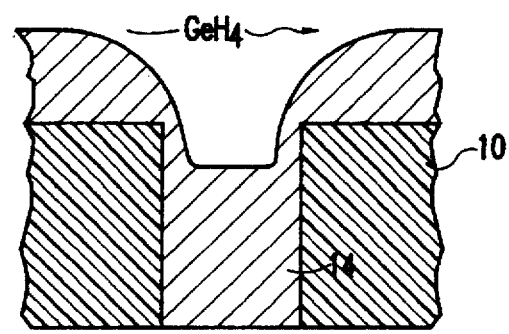

Referring to FIGS. 2(a)–2(b), a second aspect of the present invention illustrates the closing of the metal gaps during PVD processing (e.g., evaporation, collimation sputtering, etc.) due to the shadowing effects mentioned above.

Specifically, by reacting the Al—Cu alloy with $GeH_4$ in a temperature range of between 300°–450° C. and preferably between 350° C. to 400° C., and even more preferably between 380° C. to 400° C. and a pressure range of 0.2 to 1 Torr in an ultrahigh velocity (UHV) reactor, voids 20 are advantageously closed, as shown in FIG. 2(b).

Figure 3A:
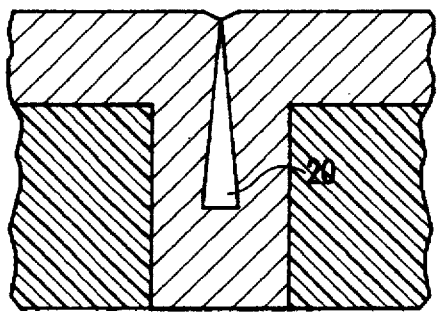
FIGS. 3(a)–3(b) are cross-sectional views of a semiconductor substrate according to the present invention in which voids encountered during a sputtering process are closed by a reaction of $GeH_4$.
Figure 3B:
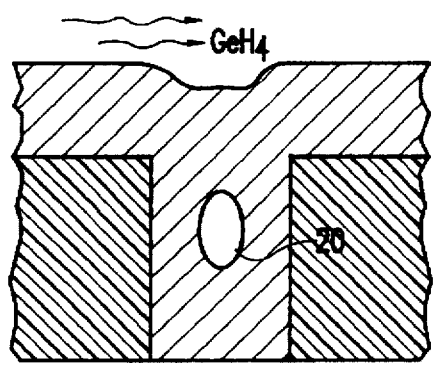

As shown in FIGS. 3(a)–3(b), similar voids encountered during standard sputtering processes are closed by the reaction of $GeH_4$ and the formation of the low melting point eutectic material. Thus, without any complicated technologies, this process can be used for manufacturing to fill vias and lines. The reaction forms the low melting point (m.p.) eutectic alloy and flows the material to the center of the void, to thereby fill the void.

Figure 4:
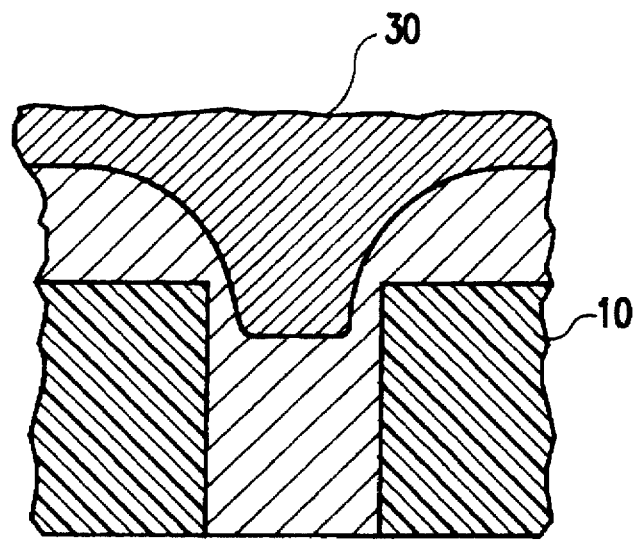
FIG. 4 is a cross-sectional view of a semiconductor substrate according to the present invention in which a layer (e.g., W—Ge) is deposited on top as a hard polishing stop.
Figure 5:
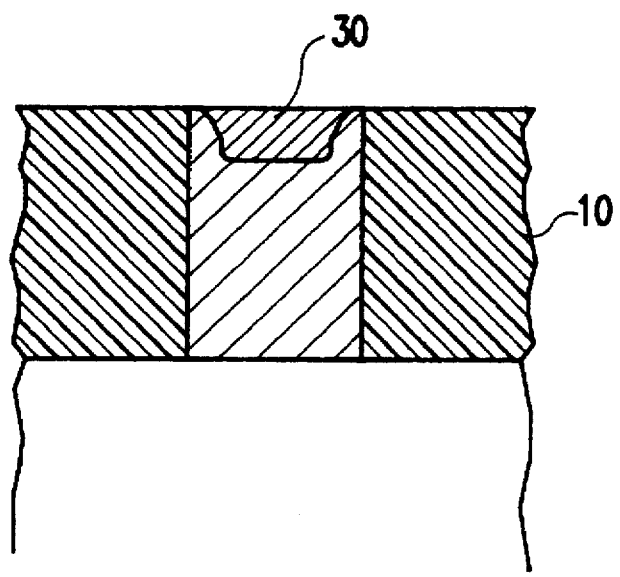
FIG. 5 is a cross-sectional view of a semiconductor substrate according to the present invention in which the lines or vias formed are etched-back or polished to form interconnect lines.

In another embodiment of the invention, once the material flow is achieved, a W—Ge layer 30 or the like is preferably deposited over the refractory material layer and the metalization, as shown in FIG. 4. The W—Ge layer 30 is advantageously used as a hard, wear-resistant polishing stop (e.g., it will be more resistant to an alumina slurry or the like in ferric nitrate used in chemical-mechanical polishing or the like). Thereafter, the lines or vias are formed and they are preferably etched-back or polished to form interconnect lines, as shown in FIG. 5.

The structure is planarized after the application of the $W_xGe_y$ to yield a structure having a conductive via or line, which includes a central, soft, low resistivity metalization 14 having a hard, wear-resistant cap made of $W_xGe_y$ or the like. The top surface of the via or line is even with the top surface of the dielectric material on the substrate. Planarization can be accomplished within one or two steps by chemical-mechanical polishing with a slurry such as alumina in dilute ferric nitrate or by RIE in the presence of $SF_6$ or $Cl_2$ based chemistry.

Alternatively to the technique described above, the lines and vias can be formed in one step by depositing the material into vias in combination with $GeH_4$ reaction and then patterning and etching the lines to form the interconnect structure.

Figure 6:
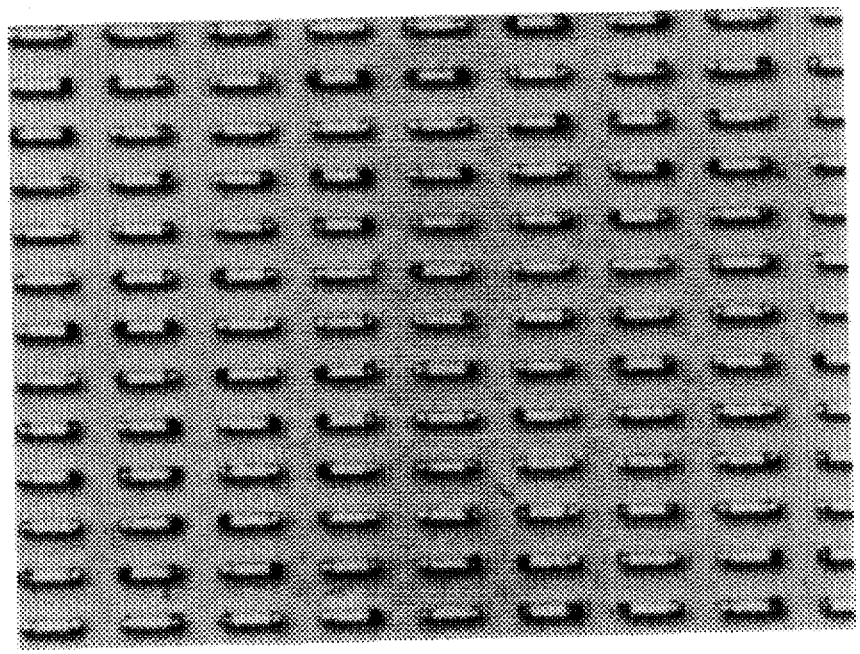
FIG. 6 is an SEM photograph of the CMP resultant of Al—Cu+GeH$_4$.
Figure 7A:
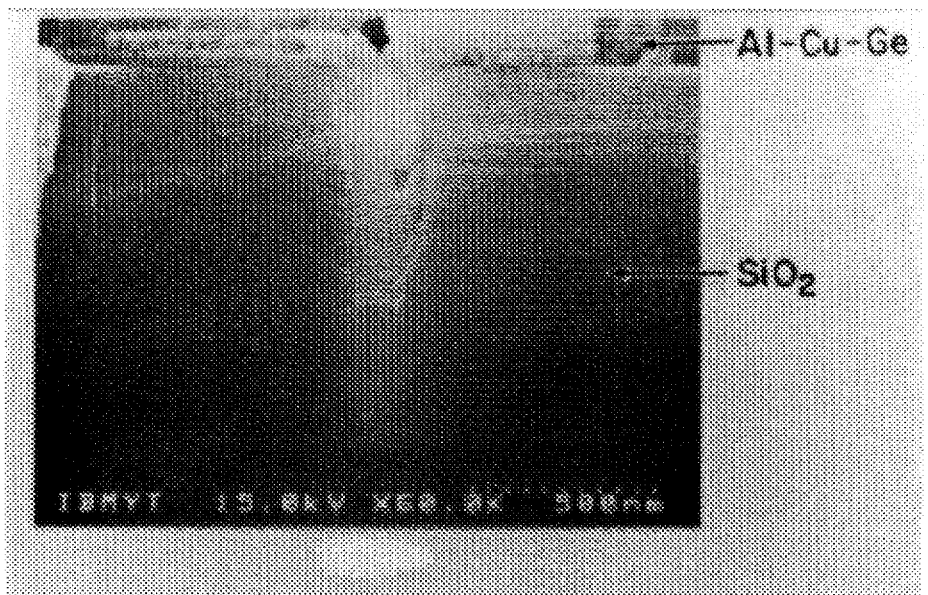
FIG. 7(a) and 7(b) are photographs illustrating GeH$_4$ being reacted to fill aspect ratios close to 4–5.
Figure 7B:
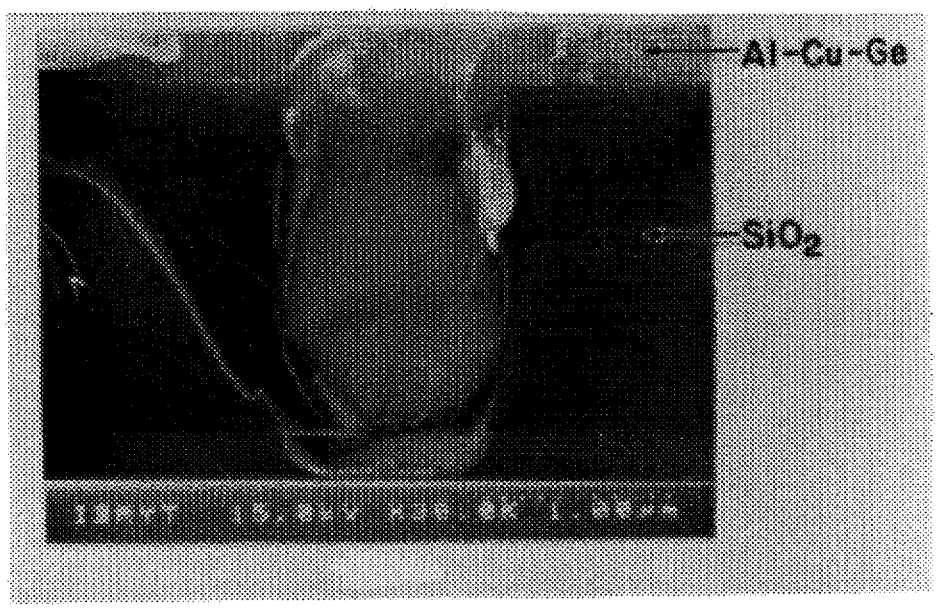

Experiments have shown that, with the present invention, a low temperature eutectic of Al—Cu—Ge ($Cu_3Ge$) can be formed with a $GeH_4$ reaction at temperatures below 400° C. and furthermore, that a low temperature Ge material containing a hard W cap can be deposited on top of the Al—Cu alloy. Using such a process (i.e., surface diffusing $GeH_4$ with Al—Cu) aspect ratios of 4 to 5 are filled without voids as shown in the photographs of FIG. 6 and FIGS. 7(a) and 7(b). The additional experiments performed using $GeH_4$ reactions are listed in Table 1 below. The data clearly shows that voids may be filled using the above-described process of the invention.

TABLE 1

| Metal | Pressure (mT) | Step Coverage | Aspect Ratio |
| --- | --- | --- | --- |
| Al—Cu | 0.2 | 100% | 3.0 |
|  | 0.5 | 100% | 2.5 |
|  | 0.8 | 100% | 2.0 |

The above-described technique provides a simple and inexpensive solution to problems which become worse as the lithographic ground rules decrease below 0.5 microns.

Further, the above technique is advantageous in that it has many applications and the process relies on surface reactions. Hence, it selectively forms a low melting point eutectic alloy in the vias only, thereby to prevent voids and seams. The process according to the invention can be used as a batch or single wafer reactor (SWR) deposition if desired. Further, the invention provides a low-cost technique which can use any PVD technique (e.g., evaporation, standard sputtering, etc.).

Further, regarding the hard cap of $W_xGe_y$, $W_3Ge_5$ –20–30 $\mu\Omega$Cm has a polish rate 1/5 of that of pure W. Further, large pads/lines and small pads/lines are protected as well in that resistances of large and small pads remain unchanged.

Experiments were conducted with the above structure and the following results were found:

| Material | Holder temperature | Resistivity |
| --- | --- | --- |
| Al—Cu—Ge | As-Dep | 3.6 $\mu\Omega$ Cm |
| | 400, 15 min | 3.2 $\mu\Omega$ Cm |
| | 400, 30 min | 4.2 $\mu\Omega$ Cm |
| | 400, 40 min | 5.9 $\mu\Omega$ Cm |
| | 400, 60 min | 8.9 $\mu\Omega$ Cm |

With the invention, in silicon back-end metallization for CMOS as well as bipolar applications to fill high aspect ratio contacts and vias with conventional techniques in combination with $GeH_4$ and $WF_6$ (if this aspect of the invention is desired) and further the electromigration performance of the Al—Cu alloys using the inventive technique and structure can be improved in relation to that of the conventional structures and methods.

Further, with the novel and unique structure and method of the present invention, expensive and complex apparatus are not required, and the use of low melting-point alloys as via fill materials is possible. These alloys can be matched with the Al—Cu lines and interconnects so as to prevent electromigration and limited lifetimes. Further, the invention is particularly useful when the lithography ground rules are less than 0.5 microns, as in, for example, fabrication of 64 Mb and 256 Mb dynamic random access memory (DRAM) structures. Additionally, the Al—Cu lines and W can be used for via interconnects between wiring layers.

In another embodiment of the invention in which high aspect ratio vias/lines are filled by surface diffusion, a low pressure sputtering process is used along with temperatures below 450° C. The invention improves the directionality at low pressure (e.g., below 1 mT, with the preferred range being from 0.2 mT to 0.8 mT) although the cosine distribution from the target prevails. If the deposition is performed at low pressure at room temperature (see Table 2 below), an aspect ratio of close to 4 can be filled without voids (see Table 2). The aspect ratio generally refers to the ratio of the height of a trench or via relative to its width (in the case of a trench) or its diameter (in the case of a via). Trenches and vias with aspect ratios greater than two are generally considered to have a high aspect ratio. By increasing the pressure at room temperature, the fill is adversely affected as shown in Table 3 below. Thus, to fill higher aspect ratio (e.g., higher than 4) moderate temperatures below 450° C. are needed. The results in FIG. 4 show that at moderately low pressures and low temperatures, higher aspect ratios (4 and above) can be filled.

One possible explanation for this behavior may be due to the increase of kinetic energy of the sputtered atoms emitted at low pressures. Such atoms with high energy have a low sticking coefficient (0.1 to 0.3) compared to sputtered atoms generated at higher pressure (0.8 mT to 1 mT). Since they have high energy (greater than 1 eV), they do not stick to a vertical wall, but instead bounce off or diffuse until a stable configuration is reached. Further, large mean free paths at lower pressure may assist in minimal collision with other atoms and thus retain the kinetic energy. Additionally, moderate temperatures (e.g., lower than 450° C.) may increase the surface diffusion characteristics of the sputtered atoms yielding a void-free fill.

Thus, at low pressures such as 0.2 to 0.8 mT, high aspect ratio (aspect ratio of 4 or more) vias may be filled with a low resistivity metal completely as shown in Tables 2, 3 and 4.

TABLE 2

| | STEP COVERAGE | | |
| --- | --- | --- | --- |
| PRESSURE | ASPECT RATIO | Al | Al—Cu (2%) |
| 0.2 mT | 1.5 | 100 | 100 |
| | 2.0 | 100 | 100 |
| | 3.0 | 100 | 98 |
| | 3.5 | 100 | 97 |
| | 4.0 | 98 | 95 |

TABLE 3

| | POOR FILL AT HIGH PRESSURES | | |
| --- | --- | --- | --- |
| ASPECT RATIO | PRESSURE | Al | Al—Cu (2%) |
| 4 | 0.4 mT | 96 | 97 |
| | 0.8 mT | 55 | 52 |
| | 2.0 mT | 32 | 30 |

TABLE 4

| | GOOD FILL AT LOW PRESSURES AND HIGH TEMPERATURES[1] | | |
| --- | --- | --- | --- |
| ASPECT RATIO | PRESSURE | Al | Al—Cu (2%) |
| 4 | 0.4 mT | 100 | 100 |
| | 0.8 mT | 100 | 100 |
| | 2.0 mT | 80 | 70 |

[1]Temperatures used were between 400 to 450° C.

Formation of Multilevel Structure

EXAMPLE 1

Figure 8:
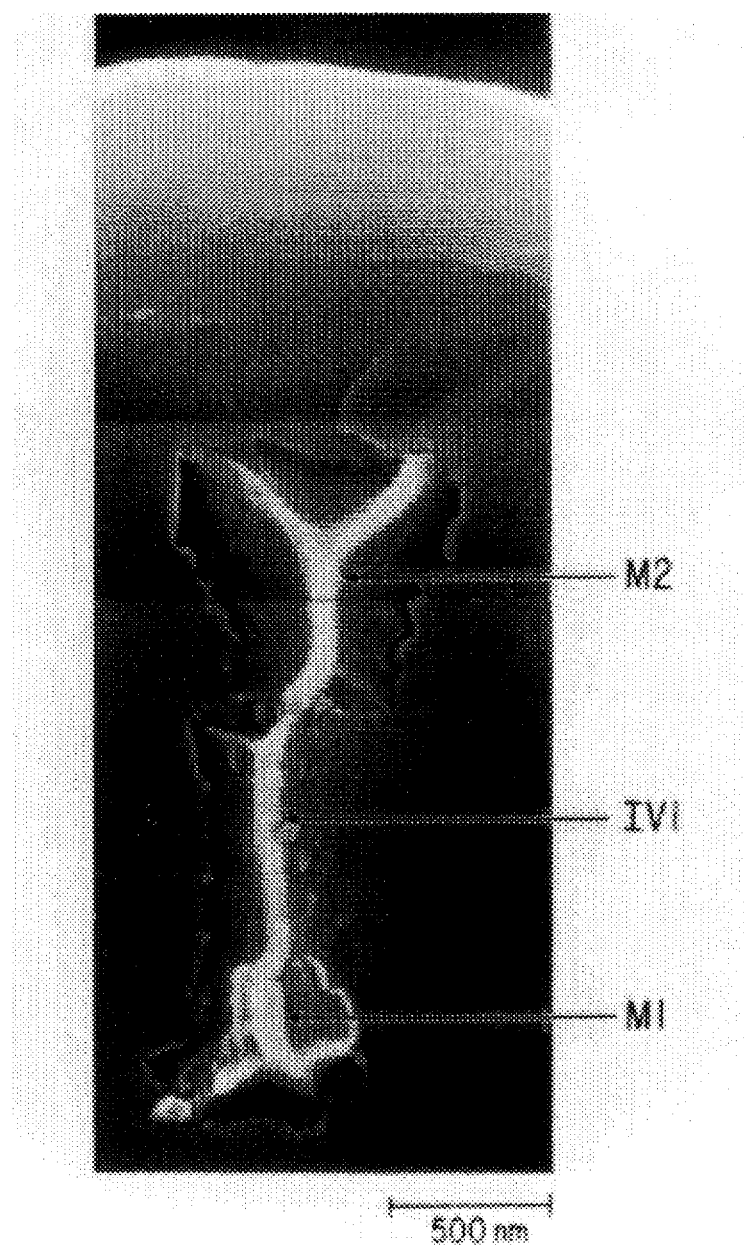
FIG. 8 illustrates a multilevel structure by Example 1.

Combination of RIE and Damascene Process (FIG. 8)

The two-level structure shown in FIG. 8 is formed by first depositing sputtered layer (0.8 microns) as a stack and then patterning to form a line. A dielectric layer, as known in the art, was deposited thereon by a deposition/etching/deposition etch process flow. Then, the dielectric was planarized by chemical and mechanical polishing.

Planarization can be accomplished within one or two steps by chemical-mechanical polishing with a slurry such as alumina in dilute ferric nitrate or by RIE in the presence of $SF_6$ or $Cl_2$ based chemistry. If chemical-mechanical polishing is employed, slurries can be selected to remove different metal layers on the stack depending on hardnesses of the metal layer.

Thereafter, vias were opened up and filled with an Al—Cu stud (having, for example, between 0 to 4% of Cu) using these two inventive processes (e.g., the $GeH_4$ reaction with Al—Cu and/or the other process of using sputtering at low pressures and high temperatures). The metal was left in the via by an etchback process employing either chemical and mechanical polishing (using an alumina and ferric nitrate slurry and low polishing pressures) and separately using RIE techniques (using $BCl_3+Cl_2+CHCl_3/N_2$).

If chemical and mechanical polishing is employed, slurries can be selected to provide scratch-free surfaces. Once again, the Ti/Al—Cu/Ti/TiN layer was deposited on top of these vias and then patterned by lithography and formed by RIE to form an interconnect. Such a structure has been electrically tested by the present inventors.

EXAMPLE 2
Dual Damascene Process (FIGS. 9(a)–9(d))

In another example, as shown in FIGS. 9(a)–9(d), a first level metal line (Ti/Al—Cu (0.5%)/Ti was formed by forming a trench in a patterned oxide, then polishing the excess metal using softer slurry (e.g., colloidal silica with a low pH compared to alumina and ferric nitrate). Thereafter, an oxide having a thickness of substantially 2 microns was deposited thereon. Patterning with metal level 2 (M2) was performed, and then the oxide was etched to 1 micron and the resist was removed. Once again, using lithography, the oxide was patterned with vias which were opened down to metal level 1 (M1) with RIE. After removing the resist, metal (e.g., Al—Cu(0.5%)) was sputter deposited at low pressures and at 400° C. Using the surface diffusion, the high aspect ratios were filled without voids.

Figure 9A:
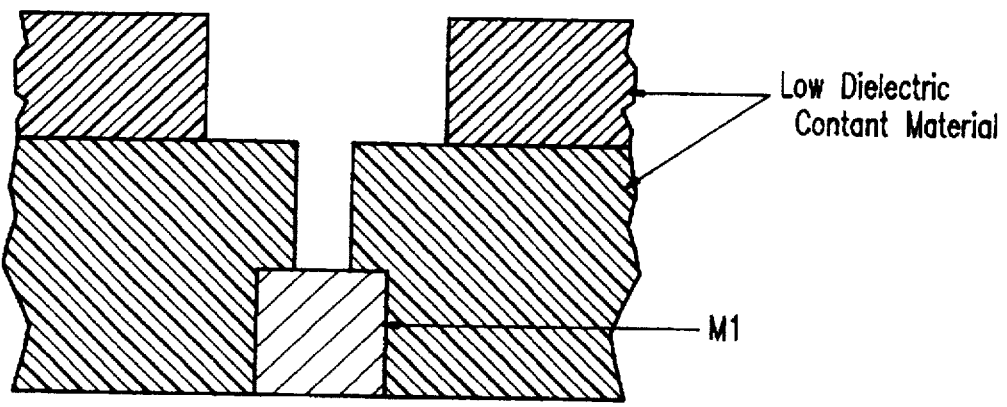
FIGS. 9(a)–9(c) illustrate a dual damascene structure process flow and FIG. 9(d) illustrates a multilevel structure produced by Example 2.
Figure 9B:
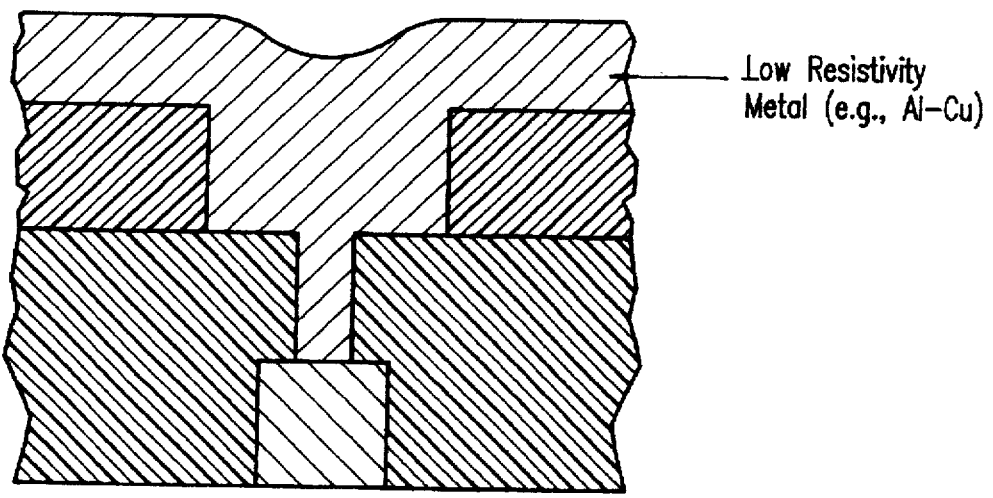
Figure 9C:
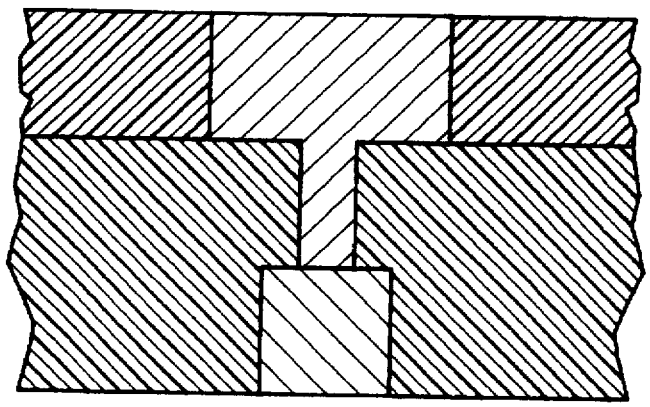
Figure 9D:
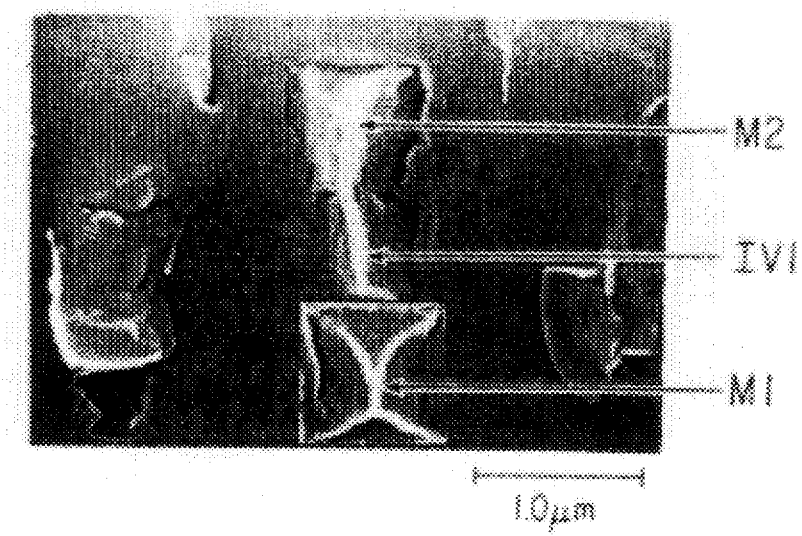

Using the above-mentioned polishing process, Al—Cu was removed from the field oxide and thus a dual damascene structure was created, as shown in FIG. 9(d).

Thus, according to the invention, a method of creating one of a dual damascene and a damascene structure in combination with reactive ion etching, on a substrate on which a stack including a metal layer (e.g., Al—Cu, Al, Al—Cu—Ge, or the like) having a predetermined hardness, is fabricated, is also provided. The method includes removing the metal layer having the predetermined hardness, by chemical and mechanical polishing using slurries having a hardness two to three times that of the material to be removed (e.g., colloidal silica in the case of Al—Cu, etc.). Furthermore, if a hard cap such as, for example, $W_xGe_y$, is employed, then harder suspension particles in the slurry can be employed (e.g., alumina or the like).

Figure 10:
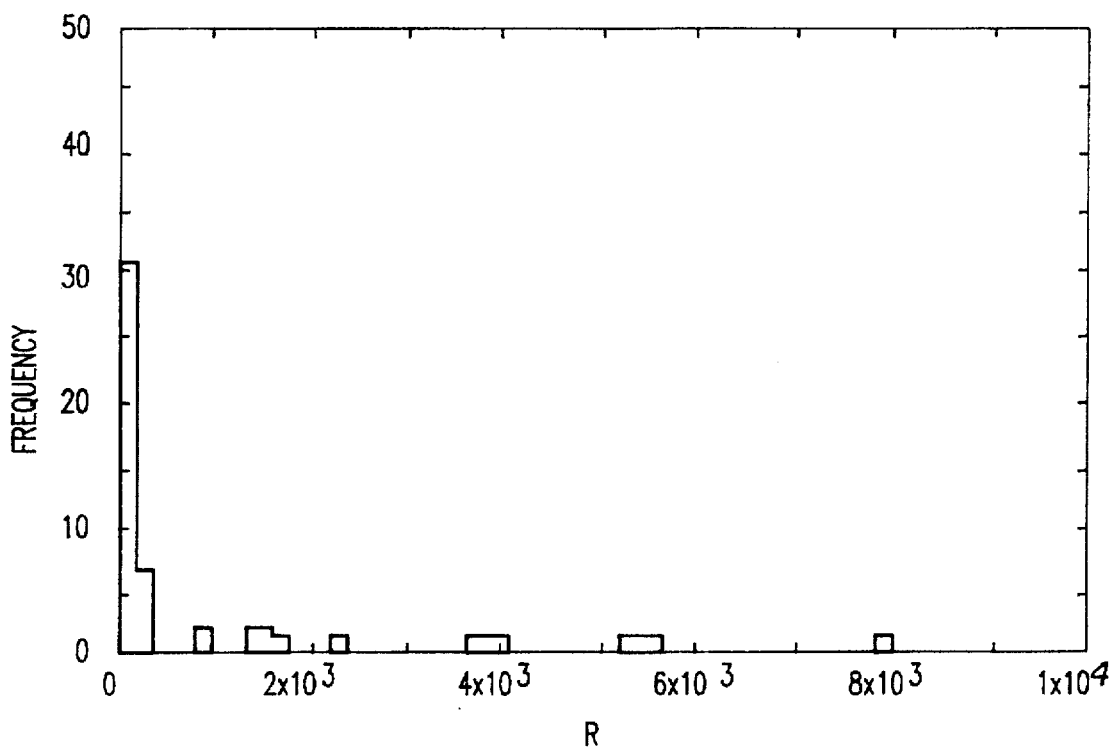
FIG. 10 illustrates via chain yield as a function of via resistance.

Electrical Results were obtained via chain resistance of the obtained multilevel structure using these different embodiments of the invention as shown in FIG. 10. The distribution is normal with a mean resistance of 0.5 kΩ Ohms for a chain (500 vias/chain, via size of 0.7 µm, and 38 chains tested). The yield on the chain is 100%. The via resistance is comparable to CVD W studs.

Electromigration testing of the two level structure (shown in FIG. 9(d)) using a 1.4 µm-wide and 300 µm long Al—2%Cu line connected by Al—Cu studs having a 1 µm diameter was performed at a current density of 1.22 MA/cm² at a temperature of 250° C. The 20% shift in resistance was used as a criterion of failure. The electromigration performance was compared against CVD W studs.

Figure 11A:
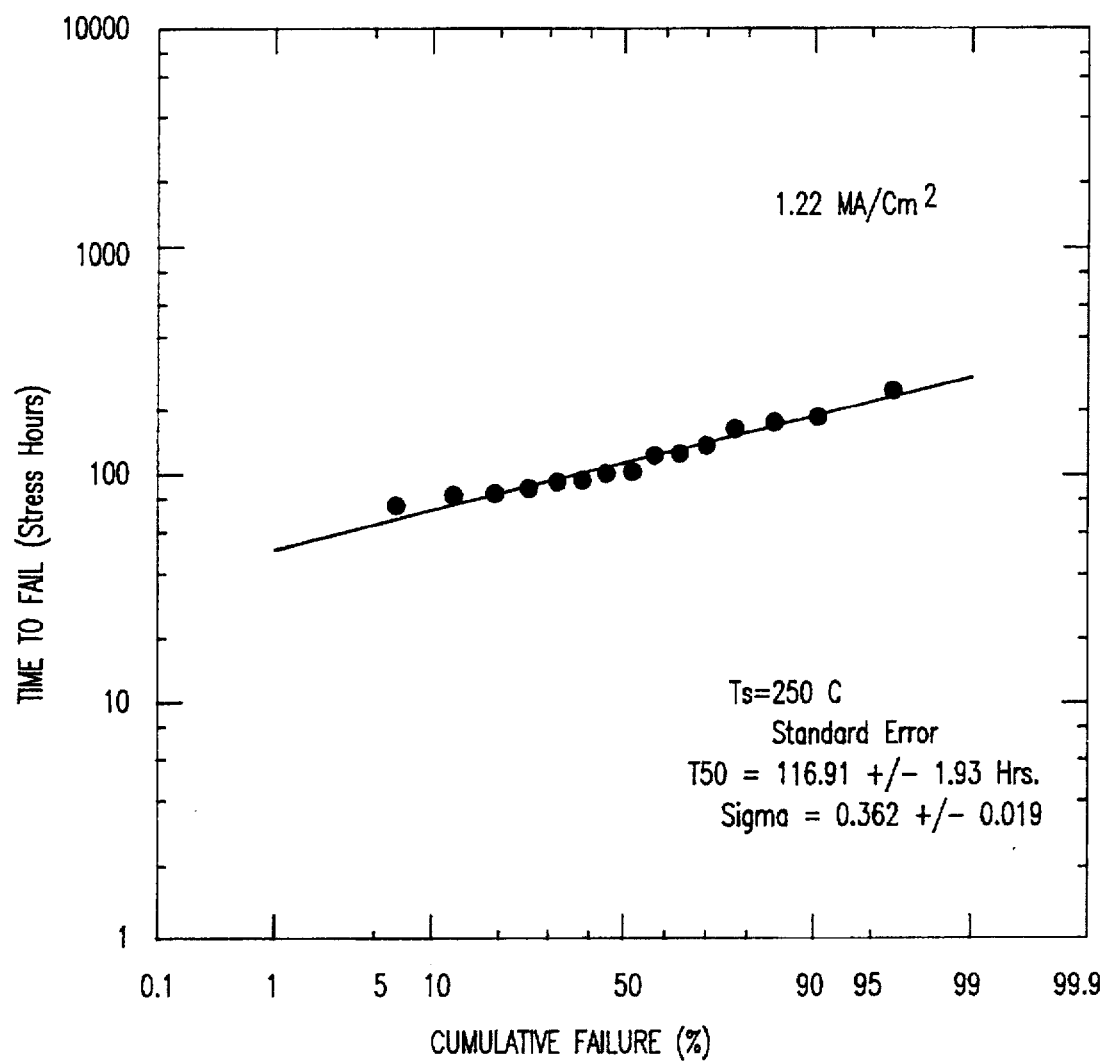
FIG. 11(a) illustrates electromigration performance of Al—Cu studs/lines by Example 1 and FIG. 11(b) illustrates electromigration performance of Al—Cu studs/lines by Example 2.
Figure 11B:
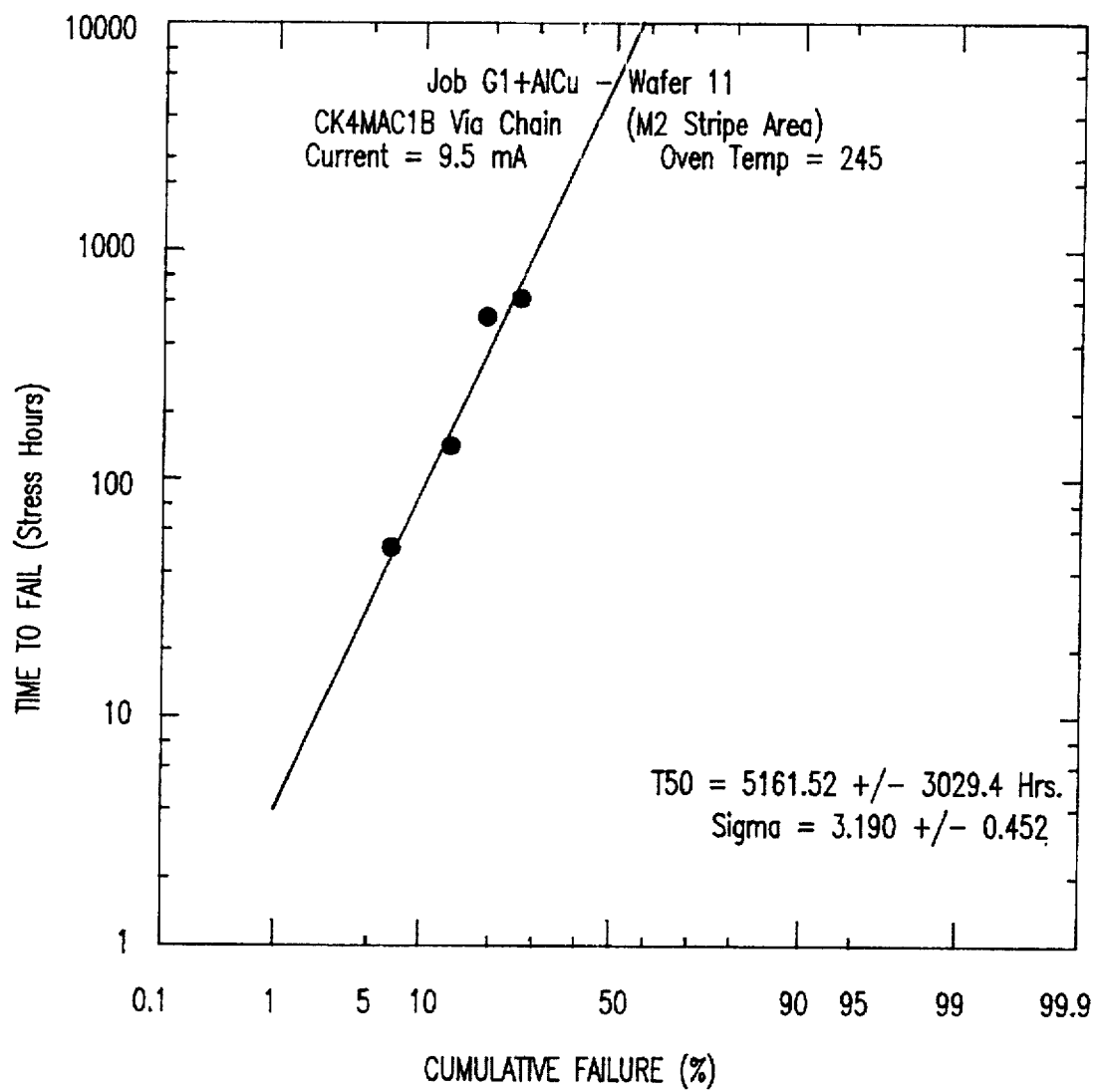

An electromigration normal logarithmic plot for Al—Cu formed GeH₄ reaction and Al—Cu alone by low pressure sputtering at 440° C. alone is shown in FIGS. 11(a) and 11(b), respectively. W via samples (not illustrated) shift to higher resistance values than Al—Cu via samples before electrical opening (i.e., complete failure). A 20% change in the resistance as the failure criterion, the Al—Cu via sample exhibits a higher mean-time-to-fail $t_{50}$ (for Al—Cu—Ge sample: 116 hours, and for low pressure 440° C. sputtered Al—Cu: 6161 hours as opposed to 86 hours for CVD W) and a higher σ than the W via samples compared with them. Hence, the Al—Cu via electromigration results show significant improvement in $t_{50}$ over CVD W via samples.

As pointed out above, several factors affect the fill for low resistivity metal including pressure and temperature which the present inventors have studied to explore the surface diffusion effects.

Figure 12:
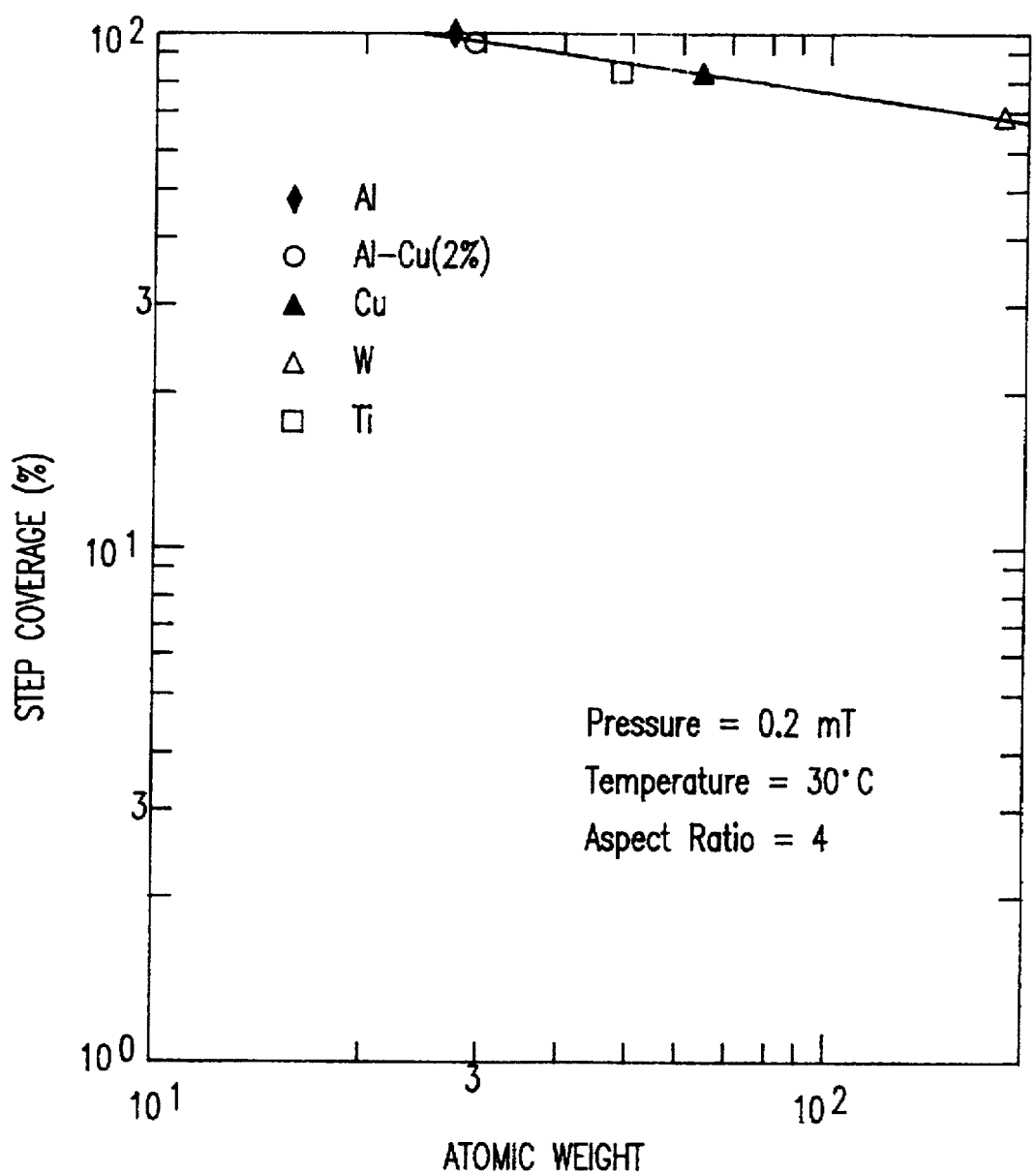
FIG. 12 is a graph illustrating the relationship of step coverage to atomic weight (or melting point) of the material at room temperature for holes/lines with an aspect ratio of 4.

FIG. 12 illustrates the relationship of step coverage to atomic weight (or melting point) of the material at room temperature for holes/lines with an aspect ratio of 4. FIG. 12 readily illustrates that with lower atomic weight or melting point material, it is easier to fill the vias at room temperatures and low pressures for aspect ratios below 4. To fill higher aspect ratios, other sputtering parameters play a key role. To achieve such material fill, a relationship between step coverages and sputtering parameters for material fill has been found by the present inventors. The relationship is as shown in Equation 2.

$$SC = K \cdot M_P^{-a} \cdot M_W^{-a} \cdot P^{-b} \cdot A_R^{-c} \cdot \theta^{-d} \cdot T^e \tag{2}$$

In Equation 2,

SC is the step coverage of the material to be filled;

$M_P$ is the melting point of the material;

$M_W$ is the atomic weight of the material;

$A^R$ is the aspect ratio of the trench or hole;

P is the operating pressure (mT);

T is the substrate temperature (°C.);

θ is a dimensionless quantity=tan(θ)=D1–D2/2H; and

K=material dependent constant.

Constants and coefficients are as follows:

a=0.2 b=0.25 (high weight)–0.51 (low weight)

$$c = 0.21–0.27$$
$$\leq 0.03 \text{ (for low weight) (e.g. Al, Al—Cu)}$$

d=0.1 e=0.6–0.7

K=3–5 (≈4.0–4.5)

D1=diameter of target

D2=diameter of substrate

H=distance between target and substrate

Hence, as illustrated in FIG. 12, the relationship of step coverage to atomic weight, or the melting point, of the material at room temperature for holes/lines with an aspect ratio of 4 is shown and it can clearly be seen that, with lower atomic weight or melting point material, filling of the vias at room temperatures and low pressures for aspect ratios below 4, can be performed more easily. Further, the above equation amply illustrates the relationship between step coverages and sputtering parameters for material fill and the fill being dependent on the atomic weight is clearly shown.

Thus, as described above, the present invention provides a novel and unique metallization for interconnecting wiring in an integrated circuit. The metallization includes a metal alloy for forming at least one of a line and via within a dielectric structure having sidewalls. The metal alloy includes a first element selected from the group consisting of aluminum, gold and silver and a second element of germanium. The metal alloy having first regions of germanium in a range of from 0 to 40 at. percent and second regions of germanium in the range of from 60 to 100 at. percent. The metal alloy preferably includes a third region of Al—Ge and Cu₃Ge. The second region of the metal alloy preferably includes a ternary metal alloy and the metallization preferably includes a layer of $W_xGe_y$ over the metal alloy.

Further, the inventive method for forming a metal alloy on a substrate having an upper surface, includes heating the upper surface of the substrate to a temperature in the range from 300° to 450° C., and flowing a gas containing germanium over the upper surface of the substrate, the upper surface having regions containing exposed aluminum, or Cu alloys, whereby the germanium in the gas reacts with the Al—Cu to form an aluminum alloy for flowing into adjacent openings due to surface tension of the aluminum alloy. The step of flowing a gas preferably includes selecting $GeH_4$. Preferably, the method also includes a step of flowing a gas containing W after the step of flowing a gas containing germanium to form a hard cap.

Further, according to the invention, filling high aspect ratio vias/lines (aspect ratio of 3 or more) can be advantageously achieved by utilizing low pressures and low temperatures (i.e., below 450° C.) without degrading the underlying metals.

Additionally, according to the present invention, material filling can be achieved using an inventive relationship of other sputtering process parameters to that of step coverage.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method of creating one of a dual damascene and a damascene structure in combination with reactive ion etching, on a substrate on which a stack is fabricated, said stack including a low resistivity metal layer including one of Al, Cu, Al—Cu, Al—Cu—Ge, and Al—Ge having a hardness, said method comprising the steps of:

removing said low resistivity metal layer having said hardness, by chemical and mechanical polishing using slurries having a hardness at least twice that of said low resistivity metal layer to be removed wherein said low resistivity metal layer has a hard cap comprising a tungsten and germanium alloy.

2. A method according to claim 1, wherein said slurry hardness is two to three times as hard as said low resistivity metal layer to be removed.

3. A method of creating one of a dual damascene and a damascene structure in combination with reactive ion etching, on a substrate on which a stack is fabricated, said stack including a metal layer having a hardness, said method comprising the steps of:

removing said metal layer having said hardness, by chemical and mechanical polishing using slurries having a hardness at least twice that of said metal layer to be removed, wherein said metal layer has a hard cap comprising a tungsten-germanium alloy and said step of removing including chemical and mechanical polishing employing a slurry including alumina.

* * * * *